United States Patent [19]

Fiedziuszko et al.

[11] Patent Number: 5,289,139
[45] Date of Patent: Feb. 22, 1994

[54] PUSH-PUSH RING RESONATOR OSCILLATOR

[75] Inventors: Slawomir J. Fiedziuszko, Palo Alto; John A. Curtis, Sunnyvale, both of Calif.

[73] Assignee: Space Systems/Loral, Palo Alto, Calif.

[21] Appl. No.: 975,781

[22] Filed: Nov. 13, 1992

Related U.S. Application Data

[63] Continuation-in-part of Ser. No. 849,504, Mar. 11, 1992, Pat. No. 5,204,641.

[51] Int. Cl.$^5$ .............................................. H03B 5/18
[52] U.S. Cl. ....................................... 331/56; 331/100; 331/114; 331/117 FE; 331/117 D; 331/107 S
[58] Field of Search ................. 331/56, 96, 99, 100, 331/114, 117 R, 117 FE, 117 D, 107 DP, 107 SL, 107 S

[56] References Cited

U.S. PATENT DOCUMENTS

| | | |
|---|---|---|
| 4,763,084 | 8/1988 | Pavio, Jr. et al. ................. 331/56 |
| 5,204,641 | 4/1993 | Fiedziuszko et al. ....... 331/107 S X |
| 5,250,910 | 10/1993 | Yabuki et al. ................. 331/114 X |

OTHER PUBLICATIONS

Ho et al., "DRO State of the Art", Applied Microwave, Spring 1990, pp. 69-80.
Sun et al., "Network Analysis Simplifies the Design of Microwave DRO's", Microwaves & RF, May, 1990, pp. 93, 94, 96, 98, 100 and 102.

Primary Examiner—David Mis
Attorney, Agent, or Firm—Perman & Green

[57] ABSTRACT

A push-push microwave oscillator has two branch oscillators fabricated of a transistor and transmission line elements extending from terminals of the transistor, and a resonator which is fabricated of an annulus of superconductor material and serves to phase lock oscillations of the two branch oscillators. The superconductor material is a composite of a rare earth element and copper oxide such as yttrium-barium-copper oxide. A first transmission line in each of the branch oscillators extends past the resonator with a spacing to provide for electromagnetic coupling between the branch oscillator and the resonator. A second transmission line in each of the branch oscillators has a length equal to approximately one-quarter wavelength of the oscillation frequency to tune the branch oscillator to a common oscillation frequency. A third transmission line in each of the branch oscillators extends towards a junction point to form a summing unit for summing oscillations of the two branch oscillators to provide an output signal of the oscillator. The oscillator is constructed in stripline or microstrip form wherein components of the branch oscillators are coplanar with the resonator and are spaced apart from a ground plane by a dielectric layer of alumina or lanthanum aluminate. Power is extracted at an even multiple of the fundamental frequency, and has a improved accuracy of frequency and reduced phase noise, the latter arising because of a characteristic of the superconductor material wherein its microwave surface resistance increase proportionally with a square of an increase in frequency.

14 Claims, 2 Drawing Sheets

RING RESONATOR

DISK RESONATOR

PATCH RESONATOR

RECT. RING RESONATOR

PUSH-PUSH RING RESONATOR OSCILLATOR

RELATED APPLICATION

This application is a continuation-in-part of application Ser. No. 07/849,504 filed Mar. 11, 1992, now U.S. Pat. No. 5,204,641.

BACKGROUND OF THE INVENTION

This invention relates to push-push oscillator circuits constructed in microstrip or stripline form and, more particularly, to a push-push microwave oscillator circuit having two active branches stabilized by a common ring resonator of superconducting material.

Push-push microwave oscillators are constructed of two active branches, each of which comprises an active element and transmission line sections, plus some form of resonator which locks the oscillations of the two branches to produce a stable output signal. One such circuit, disclosed in Pavio, Jr. et al., U. S. Pat. No. 4,763,084, employs a circular disk of dielectric material to serve as a common resonator for the two branches. Dielectric resonator stabilized oscillators (DRO's) are described also in an article entitled "DRO State of the Art" by Chen Y. Ho et al., appearing in the journal APPLIED MICROWAVE, Spring 1990, Pages 69–80. The dielectric resonator is constructed of a ceramic material which is specially prepared for use at the microwave frequencies, and is subsequently inserted into the oscillator circuit and precisely positioned near a transmission line to provide a desired amount of coupling for stabilizing the oscillator frequency.

A problem arises in that the foregoing type of oscillator circuitry does not provide as high a frequency stability as may be desired for certain signal processing applications such as for satellite communication systems. A further problem arises because the foregoing type of resonator must be fabricated separately from the oscillator circuit, and has a thickness which is larger than that of components of a stripline or microstrip circuit, both of these considerations militating against automated manufacture of the oscillator circuit in large quantities.

SUMMARY OF THE INVENTION

The aforementioned problems are overcome and other advantages are provided by construction of an oscillator circuit of two oscillator branches which are joined together in a push-push configuration with a common resonator wherein, in accordance with the invention, the resonator has the shape of a ring or annulus, and is fabricated of a film of superconductor material which can be constructed with other components of the oscillator by photolithographic manufacturing procedures. This enables precise positioning and configuring of the resonator for automated assembly of the oscillator in large quantities while insuring accurate control of the oscillation frequency. The oscillator can be constructed in stripline or microstrip form, or other form such as slot line if desired.

By way of example in the construction of the resonator, a suitable superconductor material is yttrium-barium-copper oxide (YBCO) which is operative to conduct electric current in a superconducting mode at a temperature less than or equal to 90 degrees Kelvin. Increased precision in the stabilization of the oscillator frequency is based on a characteristic of the superconductor material wherein the microwave surface resistance of the material increases proportionally with the square of an increase in frequency. The quality factor (Q) is improved by approximately an order of magnitude. Oscillations are produced by oscillators of the two branches, and are phase locked by electromagnetic coupling of the two branches to the common resonator. The push-push configuration enables extraction of higher order harmonic components of the oscillation which, in view of the foregoing frequency-squared relationship, provides a significant improvement in phase noise performance. Oscillation signals at the fundamental oscillation frequency and odd multiples thereof are canceled by an antiphase relationship between the two branches of the push-push configuration, but oscillation signals at the even multiples of the fundamental oscillation frequency have a cophasal relationship and are summed together to be outputted by the oscillator.

BRIEF DESCRIPTION OF THE DRAWING

The aforementioned aspects and other features of the invention are explained in the following description, taken in connection with the accompanying drawing wherein.

DETAILED DESCRIPTION

Figure 1:
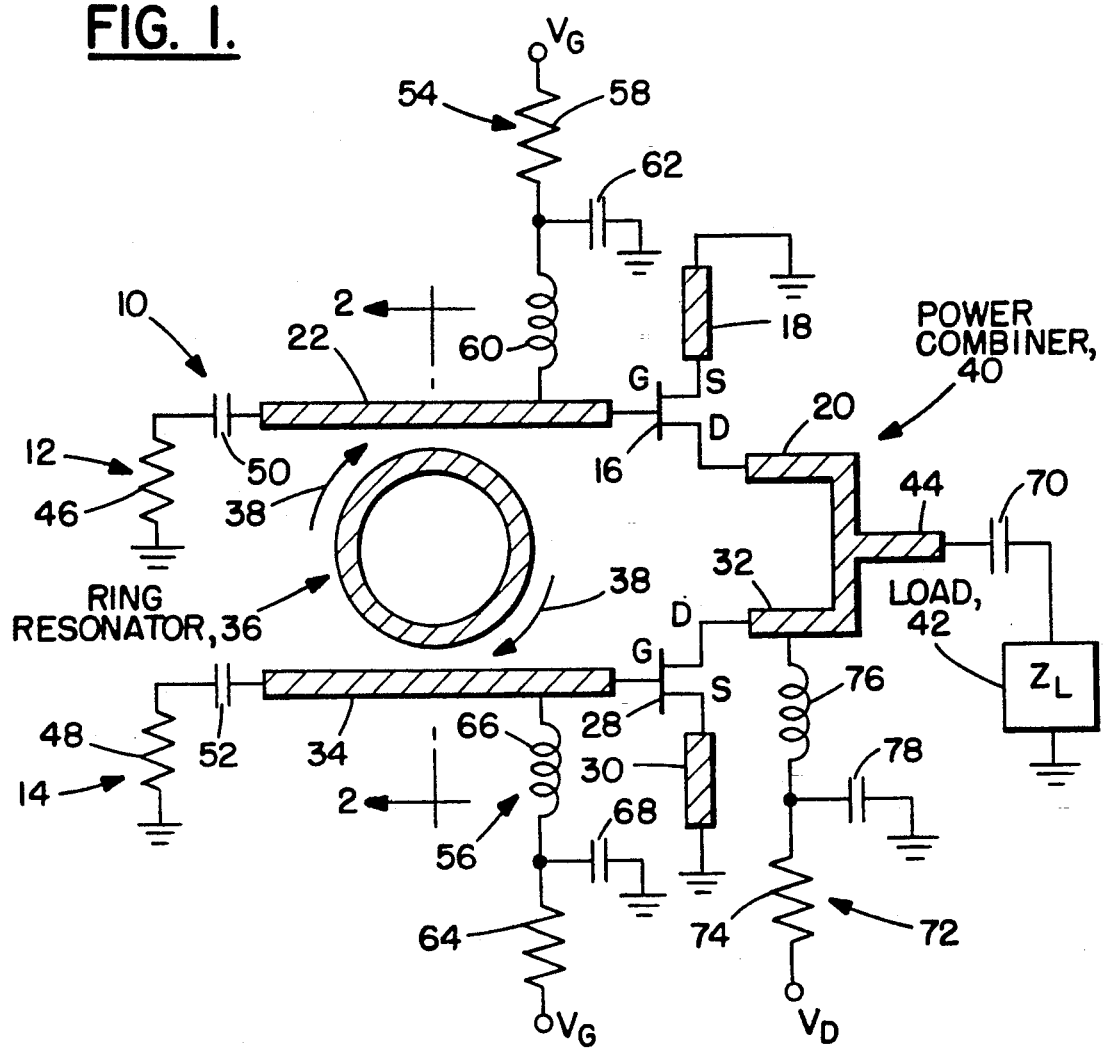
FIG. 1 shows a schematic view of circuitry of a push-push oscillator in accordance with the invention, the figure showing also the arrangement in plan view of transmission line components and a ring resonator of the oscillator circuit.
Figure 2:
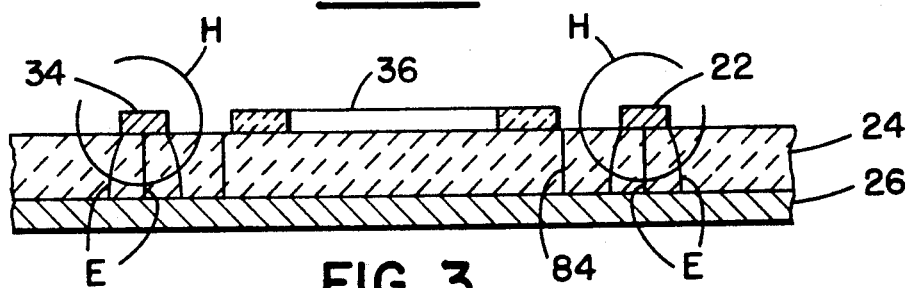
FIG. 2 shows a sectional view of a ring resonator portion of the circuit in microstrip form in accordance with a first embodiment of the invention, the view of FIG. 2 being taken along the line 2—2 in FIG. 1.

With reference to FIGS. 1 and 2, a push push oscillator 10 is constructed in accordance with the invention and includes two branches 12 and 14 each of which is constructed as an oscillator. The oscillator of the first branch 12 comprises a transistor 16 which may be either a field effect transistor or bipolar junction transistor, the field effect transistor being employed in the preferred embodiment of the invention and being shown in FIG. 1. By way of example, the transistor 16 may be fabricated of gallium arsenide to be operative at a low temperature such as 90 degrees Kelvin. The transistor 16 includes a source, a drain and a gate with the respective terminals being indicated by the letters S, D, and G, in FIG. 1.

Three transmission lines 18, 20, and 22 are connected respectively, to the source terminal, the drain terminal, and the gate terminal of the transistor 16. As shown in FIG, 2, the transmission line 22 is disposed on a top surface of a dielectric layer 24 in a microstrip structure wherein a ground plane in the form of a metallic sheet 26 is disposed on a bottom surface of the dielectric layer 24. By way of example in the construction of the microstrip structure, the sheet 26 may be fabricated of copper or aluminum, and the dielectric layer 24 may be formed of a ceramic, alumina. The other transmission lines 18 and 20 are disposed similarly upon the layer 24 in the microstrip form of construction.

The oscillator of the second branch 14 is constructed in the same fashion as the oscillator of the first branch 12 and includes a transistor 28 and three transmission lines 30, 32, and 34. The transistor 28 is identical to the transistor 16, and the transmission lines 30 32, and 34 connect respectively with the source, the drain, and the gate terminals of the transistor 28 and have the same lengths and characteristic impedances as do the corresponding transmission lines 20, 22 and 24 of the first branch 12. As shown in FIG. 2, the transmission line 34 is disposed upon the top surface of the dielectric layer 24 and forms a part of the microstrip structure as does the transmission line 22. The transmission lines 30 and 32 similarly form a part of the microstrip structure.

In accordance with the invention, a common resonator 36 is shared by the two branches 12 and 14 of the oscillator 10, and is constructed as a ring or annulus of superconductor material. By way of example in the construction of the resonator 36, a suitable superconductor material is yttrium-barium-copper oxide (YBCO) which is operative to conduct electric current in a superconducting mode at a temperature less than or equal to 90 degrees Kelvin. Other similar superconductor materials such as a combination of copper oxide with other rare earth metals such as bismuth or thallium, and the substitution of strontium for barium may be employed, if desired, in constructing the resonator 36. Electromagnetic fields surrounding the transmission lines 22 and 34, as indicated by the magnetic field lines H and the electric field lines E in FIG. 2, link with the resonator 36 to provide for electromagnetic coupling between the resonator 36 and the transmission lines 22 and 34. Oscillatory fields in the transmission lines 22 and 34 produced by oscillations in the oscillators of the branches 12 and 14 induce a current, indicated by arrows 38, which circulates in alternating fashion about the ring of the resonator 36.

The oscillators of the branches 12 and 14 are tuned by the transmission lines 18 and 30 to resonate at the same frequency. This is accomplished by making the electrical lengths of the transmission lines 18 and 30 approximately equal to one-quarter of the wavelength at the fundamental mode of oscillation. However, in view of the opposite direction of current flow in the portions of the resonator 36 adjacent each of the transmission lines 22 and 34, the oscillations of the branches 12 and 14 are 180 degrees out of phase with each other. The selection of lengths of the transmission lines 18 and 30, and the selection of the distance of the resonator 36 along the transmission lines 22 and 34 from the gate terminals G of the transistors 16 and 28 is accomplished in a manner following the procedures disclosed in the aforementioned U.S. Pat. No. 4,763,084. By way of example, the outer diameter of the resonator 36 has a length of 0.200 inch for an oscillation frequency of 5 GHz (gigahertz). At a higher frequency the resonator is smaller, for example, approximately 0.040 inch at a frequency of 25 GHz. The inner diameter of the resonator 36 is in the range of approximately 80–85% of the outer diameter. These dimensions are employed with the aforementioned alumina substrate, and differ for substrate material of different dielectric constant.

In the operation of the oscillator 10, the contributions of the two branches 12 and 14 are combined at a power combiner 40 to output the combined power to a load 42 having an impedance $Z_L$ which, preferably, is a matched load to reduce reflections and maximize power transfer. The power combiner includes the transmission lines 20 and 32, and further comprises a third transmission line 44 which interacts with the transmission lines 20 and 32 to provide for the summation of signals outputted by the two branches 12 and 14. In each of the branches 12 and 14, the oscillators are operative to produce a fundamental mode of oscillation as well as higher order harmonics of the fundamental frequency. In view of the fact that the oscillations at the fundamental frequency of the two branches 12 and 14 are out of phase with each other, the two signals cancel to produce a zero output at the fundamental frequency of oscillation. However, at the first harmonic which is double the fundamental frequency, the signals of the two branches 12 and 14 are in phase and sum together at the power combiner 40 to provide a useful power output to the load 42.

The transmission lines 22 and 34 are terminated by resistors 46 and 48, respectively, which provide matched loads to the transmission lines 22 and 34, a typical value being 50 ohms. In order to provide DC (direct current) bias to the terminals of the transistors 16 and 28, the transmission lines 22 and 34 are connected via capacitors 50 and 52 to the resistors 46 and 48, respectively, to block DC from the resistors 46 and 48. Bias supply circuits 54 and 56 provide bias voltages to the gate terminals G of the transistors 16 and 28, respectively. In the bias circuit 54, a resistor 58 and an inductor 60 are serially connected between a terminal $V_G$ of a power supply and the gate terminal G of the transistor 16. A capacitor 62 connects from ground to a junction of the resistor 58 with the inductor 60. The inductor 60 acts as a choke to prevent oscillation signals from reaching the power supply, and the capacitor bypasses any oscillation signals to ground. This bias circuit is provided, by way of example, it being understood that other forms of bias circuit may be employed.

The bias circuit 56 is constructed and operates in the same fashion as the bias circuit 54, and includes a resistor 64 and an inductor 66 serially connected between the terminal $V_G$ of the power supply and the gate terminal G of the transistor 28. A capacitor 68 connects from ground to a junction of the resistor 64 with the inductor 66. The source terminals S of the transistors 16 and 28 are grounded via the transmission lines 18 and 30. Biasing of the drain terminals D of the transistors 16 and 28 is accomplished in by use of the power combiner 40. The transmission line 44 connects to the load 42 via a capacitor 70 which blocks DC. A bias supply circuit 72 connects between a terminal $V_D$ of a drain power supply and the power combiner 40 to supply bias current to the drain terminals D. The bias circuit 72 is constructed and operates in the same fashion as the bias circuit 54, and includes a resistor 74 and an inductor 76 serially connected between the terminal $V_D$ of the power supply and the combiner 40. A capacitor 78 connects from ground to a junction of the resistor 74 with the inductor 76.

Figure 3:
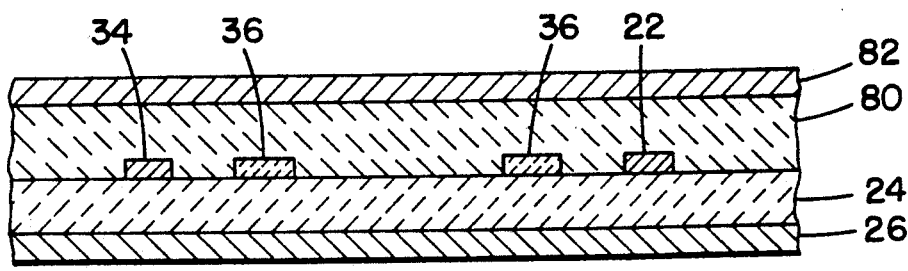
FIG. 3 shows a sectional view corresponding to that of FIG. 2, FIG. 3 showing an alternative embodiment of the invention constructed in stripline.

If desired, the oscillator 10 can be constructed in stripline form as shown in FIG. 3. This is accomplished by placing an additional dielectric layer 80 on top of the resonator 36 and the transmission lines 22 and 34, with a top metallic sheet 82 disposed upon the top surface of the dielectric layer 80 to serve as a second ground plane. The dielectric layer 80 is formed of the same material as the layer 24, and the sheet 82 is formed of the same material as the sheet 26. In both embodiments of the invention, the resonator 36 has the same planar annular form.

In both embodiments of the invention, there is a spacing of 0.025 inch between the resonator 36 and a ground plane, namely, the single ground plane of the metallic sheet 26 (FIG. 2) or the two ground planes of the sheets 26 and 82 (FIG. 3). if desired, the layers 24 and 80 may be fabricated of lanthanum aluminate, in which case the foregoing spacing may be reduced to 0.020 inch. With respect to the dielectric layer 24 of alumina, if desired, a central portion 84 (FIG. 2) of the dielectric layer 24 in contact with the resonator 36 may be replaced with other dielectric material, particularly lanthanum aluminate which has a dielectric constant of 25, this being higher than that of the alumina and enabling a corresponding decrease in the diameter of the resonator 36 by decreasing the wavelength of the electromagnetic radiation resonating at the resonator 36. A corresponding change may be made in both layers 24 and 80 (FIG. 3) by introduction of central portions of lanthanum aluminate (not shown). A typical value of the thickness of the annulus of the resonator 36 is approximately 500 microinches. The oscillator 10 is maintained in a temperature controlled chamber (not shown) for providing the requisite temperature of approximately 90 degree Kelvin for operation of the superconductor material of the resonator 36. The invention provides significant improvement over previous oscillators by higher frequency stability, lower phase noise, smaller size and mass, as well lower manufacturing cost and the benefit of photolithographic techniques which permit mass production of identical oscillators operating at the same frequency.

Figure 4:
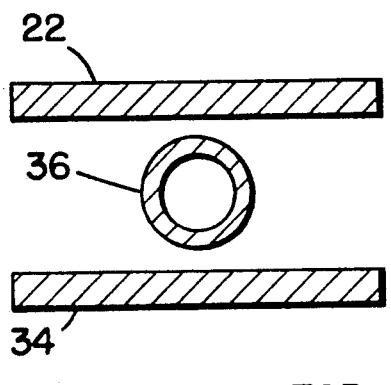
FIGS. 4–7 show, in diagrammatic plan view, various configurations of microstrip resonators.
Figure 5:
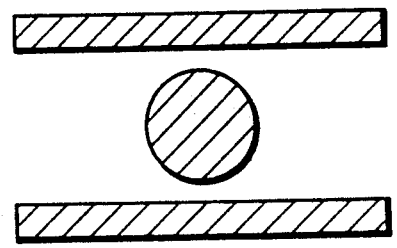
Figure 6:
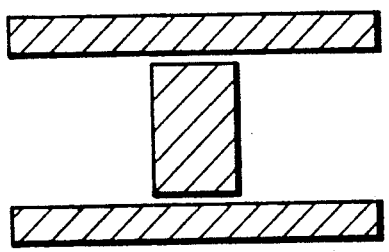
Figure 7:
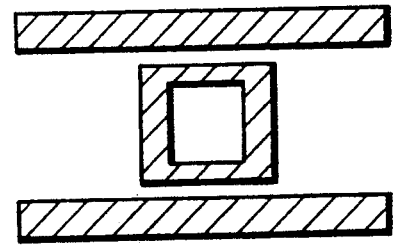

By way of alternative embodiments to the invention, it is noted that the inventive feature of substituting a relatively thin microstrip resonator in place of the aforementioned relatively thick ceramic element of a dielectric resonator stabilized oscillator can be accomplished with microstrip resonators of various forms, as shown in FIGS. 4-7. FIG. 4 shows the ring-shaped resonator 36 disposed between the transmission lines 22 and 34, previously described in FIG. 1 and presented here to facilitate comparison with the resonators of FIGS. 5-7. FIG. 5 shows a solid disk resonator having a circular perimeter, while in FIG. 6 there is a disk resonator of rectangular perimeter. FIG. 7 shows a ring resonator having a square shape. The principles of operation for the various embodiments are the same; for example, the transverse dimension of the rectangular resonator (FIG. 6), perpendicular to the transmission lines, is one-half wavelength.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A push-push superconductor resonator oscillator comprising:
    a resonator comprising an annulus of superconductor material;
    a first oscillator and a second oscillator phase locked by said resonator; and
    means for summing oscillation signals produced by said first and said second oscillators to provide an output signal from said superconductor resonator oscillator.

2. A superconductor resonator oscillator according to claim 1 wherein each of said first and said second oscillators comprises an active element and a plurality of transmission lines connected to terminals of the active element, wherein a first transmission line of each of said first and said second oscillators provides for electromagnetic coupling to said resonator to accomplish said phase locking.

3. A superconductor resonator oscillator according to claim 2 wherein a second transmission line in each of said first and said second oscillators has a length which tunes the respective one of said first and said second oscillators to a specific frequency, and wherein the active element in each of said first and said second oscillators is a transistor.

4. A superconductor resonator oscillator according to claim 3 wherein said first and said second oscillators are constructed in a configuration coplanar with a plane of said annulus, said superconductor resonator oscillator including a ground plane parallel to the plane of said resonator and a dielectric layer disposed between said resonator and said ground plane.

5. A superconductor resonator oscillator according to claim 4 wherein said superconductor resonator oscillator is constructed in the form of stripline or microstrip, and the arrangement and composition of components of the superconductor resonator oscillator permit manufacture by photolithography.

6. A superconductor resonator oscillator according to claim 4 wherein said summing means is constructed in planar transmission line form spaced apart from said ground plane by said dielectric layer.

7. A superconductor resonator oscillator according to claim 6 wherein the first transmission line in said first oscillator is parallel to the first transmission line in said second oscillator, and wherein said resonator is disposed between and at equal distance from the first transmission line of said first oscillator and the first transmission line of said second oscillator.

8. A superconductor resonator oscillator according to claim 2 wherein the active element in each of said first and said second oscillators is operative at a common temperature with said superconductor.

9. A superconductor resonator oscillator according to claim 8 wherein said common temperature is less than or equal to approximately 90 degrees Kelvin, and said superconductor material is a composite of a rare earth element and copper oxide.

10. A superconductor resonator oscillator according to claim 9 wherein said superconductor material is yttrium-barium-copper oxide.

11. A superconductor resonator oscillator according to claim 10 wherein said first and said second oscillators are constructed in a coplanar configuration with a plane of said resonator, said superconductor resonator oscillator includes a ground plane parallel to the plane of said resonator and a dielectric layer disposed between said resonator and said ground plane, and said dielectric layer is alumina or lanthanum aluminate.

12. A push-push superconductor resonator oscillator comprising:
    a resonator constructed in stripline or microstrip form, said resonator comprising a disk of superconductor material, said disk having annular or solid configuration;
    a first oscillator and a second oscillator phase locked by said resonator; and
    means for summing oscillation signals produced by said first and said second oscillators to provide an output signal from said superconductor resonator oscillator.

13. A superconductor resonator oscillator according to claim 12 wherein each of said first and said second oscillators comprises an active element and a plurality of transmission lines connected to terminals of the active element, wherein a first transmission line of each of said first and said second oscillators provides for electromagnetic coupling to said resonator to accomplish said phase locking, said first transmission line of each of said first and said second oscillators being constructed in stripline or microstrip form.

14. A superconductor resonator oscillator according to claim 13 wherein a second transmission line in each of said first and said second oscillators has a length which tunes the oscillator to a specific frequency, and wherein the active element in each of said first and said second oscillators is a transistor, and the configuration of said resonator is a circular annulus or a square annulus or a circular solid or a rectangular solid.

* * * * *